(12) United States Patent
Sah et al.

(10) Patent No.: US 10,437,400 B2
(45) Date of Patent: Oct. 8, 2019

(54) TOUCH INPUT DEVICE

(71) Applicants: Hyundai Motor Company, Seoul (KR); Kia Motors Corporation, Seoul (KR)

(72) Inventors: Sung Jin Sah, Gyeonggi-do (KR); Kwang Myung Oh, Gyeonggi-do (KR); Sung Min Park, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 42 days.

(21) Appl. No.: 15/795,446

(22) Filed: Oct. 27, 2017

(65) Prior Publication Data

US 2018/0129322 A1  May 10, 2018

(30) Foreign Application Priority Data

Nov. 3, 2016 (KR) .................. 10-2016-0145648

(51) Int. Cl.
*G06F 3/02* (2006.01)
*G06F 3/041* (2006.01)
(Continued)

(52) U.S. Cl.
CPC .............. *G06F 3/044* (2013.01); *B60K 37/06* (2013.01); *G06F 3/02* (2013.01); *H03K 17/955* (2013.01);
(Continued)

(58) Field of Classification Search
CPC ................ B60K 37/06; B60K 2350/30; B60K 2350/1024; B60K 2350/1028;
(Continued)

(56) References Cited

U.S. PATENT DOCUMENTS 5,038,142 A    8/1991  Flower et al.
5,201,410 A *  4/1993  Takano .................. H01H 13/14
                                              200/252

(Continued)

FOREIGN PATENT DOCUMENTS

| CN | 202995673 U | 6/2013 |
| JP | 2016-507119 A | 3/2016 |
| WO | 2014/124173 A1 | 8/2014 |

OTHER PUBLICATIONS

Liwei Chan, et al., "CapStones and ZebraWidgets: Sensing Stacks of Building Blocks, Dials and Sliders on Capacitive Touch Screens", Session: Dimensions of Sensory Interaction, CHI 2012, pp. 2189-2192, May 5-10, 2012.

*Primary Examiner* — Michael J Eurice
(74) *Attorney, Agent, or Firm* — Mintz Levin Cohn Ferris Glovsky and Popeo, P.C.; Peter F. Corless

(57) ABSTRACT

A touch input device includes a touch sensing element having at least two input parts partitioned by at least one partition line, a plurality of force sensors mounted on a bottom surface of the touch sensing element, and at least one support member mounted on the bottom surface of the touch sensing element to provide reaction force to an elastic sensing element in a vertical direction and serving as the partition line. In at least one of the two input parts, a moment based on a shearing force may be canceled by the support member.

13 Claims, 14 Drawing Sheets

(51) Int. Cl.
*G06F 3/044* (2006.01)
*B60K 37/06* (2006.01)
*H03K 17/955* (2006.01)
*H03K 17/96* (2006.01)
*H01K 13/04* (2006.01)

(52) U.S. Cl.
CPC .... B60K 2370/143 (2019.05); B60K 2370/40 (2019.05); G06F 3/0224 (2013.01); G06F 3/041 (2013.01); G06F 2203/04101 (2013.01); G06F 2203/04105 (2013.01); H01K 13/04 (2013.01); H03K 17/9622 (2013.01); H03K 17/9625 (2013.01); H03K 2217/96054 (2013.01)

(58) Field of Classification Search
CPC . B60K 2350/1036; G06F 3/02; G06F 3/0224; G06F 3/02228; G06F 3/041; G06F 3/044; G06F 2203/04101; G06F 2203/04105; H01K 13/04; H01K 13/14; H01K 13/86; H03K 17/955; H03K 17/9622; H03K 17/9625; H03K 2217/96054
See application file for complete search history.

(56) References Cited

U.S. PATENT DOCUMENTS

| | | | | |
|---|---|---|---|---|
| 6,333,478 B1* | 12/2001 | Altmann | ............... | H01H 13/04 200/314 |
| 8,330,713 B2 | 12/2012 | Stelandre et al. | | |
| 2002/0149571 A1* | 10/2002 | Roberts | ............... | G06F 3/0414 345/174 |
| 2004/0125086 A1* | 7/2004 | Hagermoser | ......... | G06F 3/0414 345/173 |
| 2005/0195156 A1* | 9/2005 | Pihlaja | ................ | G06F 3/0338 345/156 |
| 2005/0224329 A1* | 10/2005 | Milo | .................... | E05B 17/22 200/341 |
| 2006/0131149 A1* | 6/2006 | Mattarelli | .............. | H01H 13/04 200/329 |
| 2006/0250377 A1* | 11/2006 | Zadesky | ............... | G06F 1/1613 345/173 |
| 2006/0290676 A1* | 12/2006 | Harada | ................. | G06F 3/0202 345/168 |
| 2007/0146343 A1* | 6/2007 | Prados | .................. | G06F 3/016 345/173 |
| 2007/0146348 A1* | 6/2007 | Villain | .................... | G06F 3/011 345/173 |
| 2008/0173525 A1* | 7/2008 | Yoshida | ................ | H01H 13/04 200/296 |
| 2008/0251371 A1* | 10/2008 | Sugahara | .............. | H01H 25/06 200/6 A |
| 2009/0066474 A1* | 3/2009 | Kawachi | ................ | B60K 37/06 340/3.1 |
| 2009/0296341 A1* | 12/2009 | Eldershaw | ............. | G06F 1/1626 361/679.43 |
| 2010/0007402 A1* | 1/2010 | Chamuczynski | ...... | H03K 17/97 327/510 |
| 2010/0020042 A1* | 1/2010 | Stelandre | ............... | B60K 35/00 345/174 |
| 2010/0110016 A1* | 5/2010 | Ladouceur | ............. | G06F 3/041 345/173 |
| 2010/0300772 A1* | 12/2010 | Lee | ..................... | G06F 3/03547 178/18.06 |
| 2010/0309130 A1* | 12/2010 | Zhao | .................... | H03K 17/9622 345/168 |
| 2011/0050587 A1* | 3/2011 | Natanzon | ............. | G06F 3/04842 345/173 |
| 2011/0107958 A1* | 5/2011 | Pance | .................... | G06F 3/016 116/205 |
| 2011/0148811 A1* | 6/2011 | Kanehira | ................ | G06F 3/044 345/174 |
| 2011/0227866 A1* | 9/2011 | Kawaguchi | ............. | G06F 3/041 345/174 |
| 2011/0315533 A1* | 12/2011 | Chu | ..................... | H01H 13/023 200/345 |
| 2012/0007822 A1* | 1/2012 | Luo | ......................... | G06F 3/041 345/173 |
| 2012/0032907 A1* | 2/2012 | Koizumi | ................ | G06F 3/0414 345/173 |
| 2012/0168288 A1* | 7/2012 | Furrer | .................... | H01H 3/122 200/61.58 R |
| 2012/0169603 A1* | 7/2012 | Peterson | ............... | G06F 3/0202 345/168 |
| 2012/0275086 A1* | 11/2012 | Pasquero | .............. | G06F 1/1626 361/679.01 |
| 2013/0002571 A1* | 1/2013 | Skinner | ................. | G06F 3/0338 345/173 |
| 2013/0026017 A1* | 1/2013 | Verd Martinez | ....... | H01H 9/161 200/307 |
| 2013/0206569 A1* | 8/2013 | Sierak | ....................... | G06F 3/02 200/600 |
| 2013/0342501 A1 | 12/2013 | Molne et al. | | |
| 2014/0086674 A1* | 3/2014 | Tsugawa | ................. | G05G 1/025 403/299 |
| 2014/0139477 A1* | 5/2014 | Immonen | ................ | G06F 3/044 345/174 |
| 2015/0061901 A1* | 3/2015 | Casparian | .............. | H01H 13/83 341/22 |
| 2015/0170852 A1* | 6/2015 | Baumann | ................ | H01H 3/022 200/43.13 |
| 2015/0200062 A1* | 7/2015 | Ura | ....................... | H01H 13/023 200/314 |
| 2015/0220147 A1* | 8/2015 | King | ..................... | G06F 3/016 345/173 |
| 2015/0228424 A1* | 8/2015 | Tallone | .................. | H01H 13/28 200/513 |
| 2015/0370376 A1* | 12/2015 | Harley | .................. | G06F 3/0414 345/174 |
| 2016/0055988 A1* | 2/2016 | Muller | ................. | H01H 13/023 200/314 |
| 2016/0124531 A1* | 5/2016 | Marwah | ................ | G06F 1/1643 345/173 |
| 2016/0133403 A1* | 5/2016 | Muller | ................... | H01H 13/20 200/345 |
| 2016/0135331 A1* | 5/2016 | Wu | ......................... | G06F 3/041 361/700 |
| 2016/0174395 A1* | 6/2016 | Seo | ........................ | H01H 13/04 361/781 |
| 2016/0293353 A1* | 10/2016 | Mau | .................... | H01H 13/14 |
| 2016/0357152 A1* | 12/2016 | Hirayama | .............. | G04C 3/007 |
| 2017/0148594 A1* | 5/2017 | Feng | .................... | H01H 13/86 |
| 2017/0169965 A1* | 6/2017 | Kim | ..................... | H01H 13/04 |
| 2017/0221654 A1* | 8/2017 | Danowski | ............. | H01H 13/70 |
| 2017/0255285 A1* | 9/2017 | Luo | ........................ | G06F 1/1632 |
| 2017/0309419 A1* | 10/2017 | Miyaoka | .............. | H01H 13/023 |
| 2017/0364190 A1* | 12/2017 | Rihn | ....................... | G06F 3/016 |
| 2018/0019079 A1* | 1/2018 | Minami | ................ | H01H 13/14 |
| 2018/0033572 A1* | 2/2018 | Ockert | .................. | G08B 25/12 |
| 2018/0047528 A1* | 2/2018 | Yamamoto | ............. | H01H 13/04 |
| 2018/0047529 A1* | 2/2018 | Tanaka | ................... | H01H 13/04 |
| 2018/0068809 A1* | 3/2018 | Hayashi | ................ | H01H 13/04 |
| 2018/0108500 A1* | 4/2018 | Hsu | ....................... | H01H 13/04 |
| 2018/0366284 A1* | 12/2018 | Hao | ................... | H01H 13/7073 |

* cited by examiner

TOUCH INPUT DEVICE

CROSS-REFERENCE TO RELATED APPLICATION

This application claims under 35 U.S.C. § 119(a) the benefit of Korean Patent Application No. 10-2016-0145648, filed on Nov. 3, 2016 in the Korean Intellectual Property Office, the entire contents of which are incorporated by reference herein.

BACKGROUND

(a) Technical Field

The present disclosure relates to a touch input device, and more particularly, to a touch input device capable of improving blind control and usability of the touch input device by detachably mounting a mechanical operating unit on a surface of a touch sensing element.

(b) Description of the Related Art

In general, a touch input device (for example, a touch screen or a touch pad) is configured to sense a touch by a pointing object (a finger of a user, a stylus tip, and the like), and to determine the characteristics (strength of power, a touch location, a moving direction, and the like) of the touch by the pointing object.

Such an input device includes various types of input devices such as a resistive-based touch input device, a capacitance-based touch input device, a force-based touch input device, an infrared-based touch input device, and a surface acoustic wave-based touch input device.

Touch input devices may be applied to various fields, and include a computer display device, a cash dispenser automation device, a mobile terminal, a touch pad of a notebook, a touch input unit for a vehicle, and the like.

Meanwhile, according to the related art, a touch input device, which is applied to a touch input unit for a vehicle, typically employs a capacitive touchpad. However, in such a capacitive touchpad, since touch areas are not mechanically partitioned, operations may be erroneously performed. In particular, the capacitive touch pad may not perform blind control, and may lack physical operability, intuitive manipulation, and affordance. Accordingly, user convenience may be degraded by use of the capacitive touchpad.

SUMMARY

An aspect of the present disclosure provides a touch input device capable of not only performing blind control, but improving user convenience by detachably mounting a mechanical operating unit, which provides physical operability, on a touch sensing element.

According to an aspect of the present disclosure, a touch input device may include a touch sensing element that senses a touch, and a mechanical operating unit detachably mounted on the touch sensing element. The mechanical operating unit may have at least one touch button movable in a vertical direction and a support body that supports the touch button.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
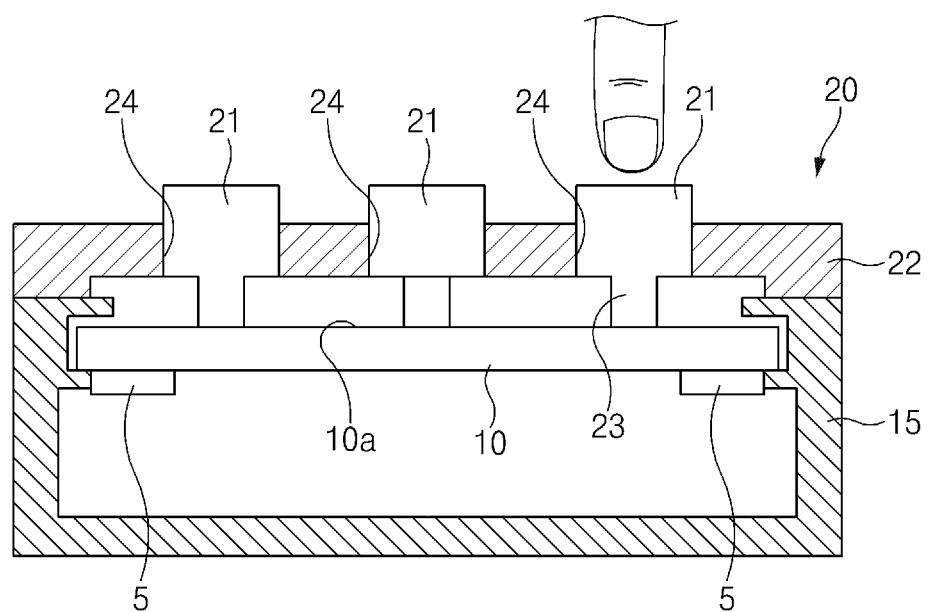
FIG. 1 is a schematic sectional view illustrating a touch input device, according to an embodiment of the disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, an embodiment of the present disclosure will be described with reference to accompanying drawings. For reference, the size of each of elements and the thicknesses of a line, which are illustrated in accompanying drawings, may be exaggerated, omitted or schematically drawn for the purpose of convenience or clarity. Furthermore, the terms used for the explanation of the present disclosure are defined, and may be changed according to the intentions and the custom of an operator or a user. Therefore, definition of the terms should be made based on inventive concept described throughout the overall specification.

Referring to FIG. 1, according to an embodiment of the present disclosure, a touch input device may include a touch sensing element 10 which senses a touch.

The touch sensing element 10 may be formed in a plate structure, and may have a top surface serving as a touch surface 10a. The touch surface 10a may be formed in a flat structure extending in a horizontal direction, or may be formed in a partially curved structure on the horizontal surface.

The touch sensing element 10 may have edges fixedly mounted into a case 15, and thus may be stably supported by the case 15.

A plurality of force sensors 5 may be mounted on a bottom surface of the touch sensing element 10. The touch sensing element 10 may be realized in a force-based touch input structure due to the force sensors 5.

The force sensors 5 may be coupled to the touch sensing element 10. In particular, the force sensors 5 may be mounted on the bottom surface of the touch sensing element 10, which corresponds to an opposite surface to the touch surface 10a. The force sensor 5 may be a strain gauge or an electrostatic force sensor.

A mechanical operating unit 20, which may provide physical operability, may be detachably mounted on the touch sensing element 10.

The mechanical operating unit 20 may include at least one touch button 21, which is movable in a vertical direction, and a support body 22 which supports the touch button 21.

The touch button 21 may include a plurality of touch buttons to provide various types of physical operability. The touch buttons 21 may be spaced apart from each other by a sufficient distance, thereby preventing mutual interference and preventing touch inputs from being repeatedly recognized.

A touch tip 23 formed on a lower end of the touch button 21 protrudes toward the touch surface 10a, and the sectional area of the touch tip 23 may be formed in size appropriate to the touch input.

The touch button 21 may be mounted in an opening 24, which is formed in the support body 22, such that the touch button 21 is movable in a vertical direction.

According to an embodiment, the touch button 21 may be mounted in the support body 22 in such a manner that the touch tip 23 is spaced apart from the touch surface 10a by a predetermined distance when the touch button 21 is not pressed, that is, when there is no touch input. To this end, the touch button 21 may be mounted in such a manner that the touch button 21 is elastically supported upward by an elastic member. In this case, only when the touch button 21 is pressed, force from the touch is applied to the touch surface 10a. Accordingly, a plurality of force sensors 5 may sense the force from the touch.

According to another embodiment, the touch button 21 may be mounted in the support body 22 in such a manner that the touch tip 23 is in contact with the touch surface 10a when the touch button 21 is not pressed, that is, when there is no touch input. In this case, even though the touch button 21 is not pressed, the loads of the touch button 21 and the support body 22 may be slightly applied to the touch surface 10a. Accordingly, the force sensors 5 may be configured to subtract the loads slightly applied to the touch surface 10a by the touch button 21 and the support body 22 and to sense the force from the touch when the touch button 21 is pressed, that is, when there is the touch input.

The support body 22 may have at least one opening 24, and the touch button 21 may be mounted in the opening 24 movably in the vertical direction.

The support body 22 may be detachably coupled to the touch surface 10a of the touch sensing element 10 or a case 15. Accordingly, when the use of the mechanical operating unit 20 is not required, the mechanical operating unit 20 may be detached from the touch surface 10a or the case 15.

Figure 2:
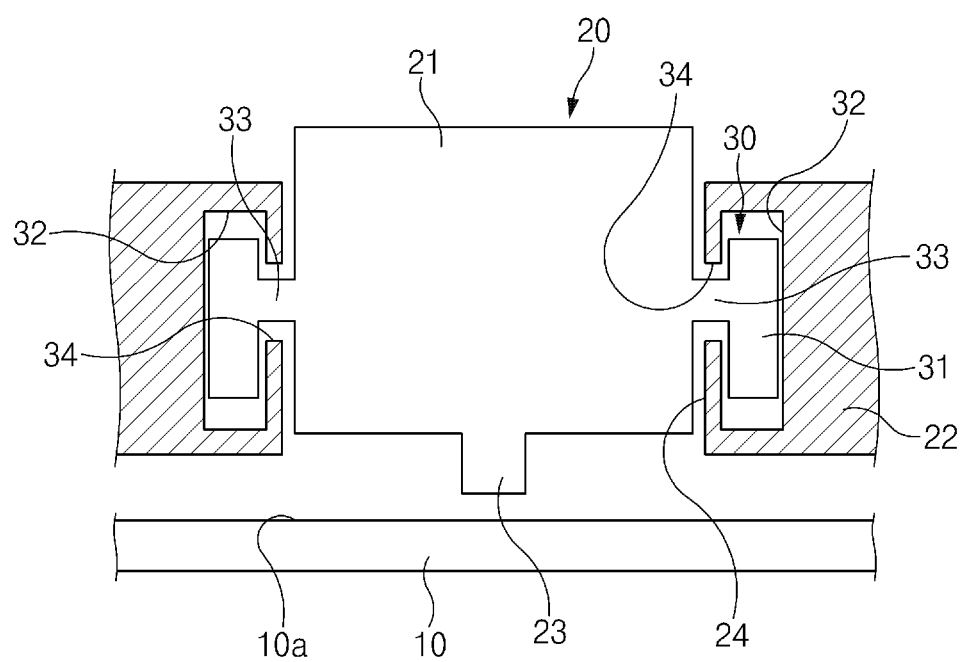
FIG. 2 is a sectional view illustrating a mechanical operating unit of the touch input device, according to an embodiment of the present disclosure.
Figure 3:
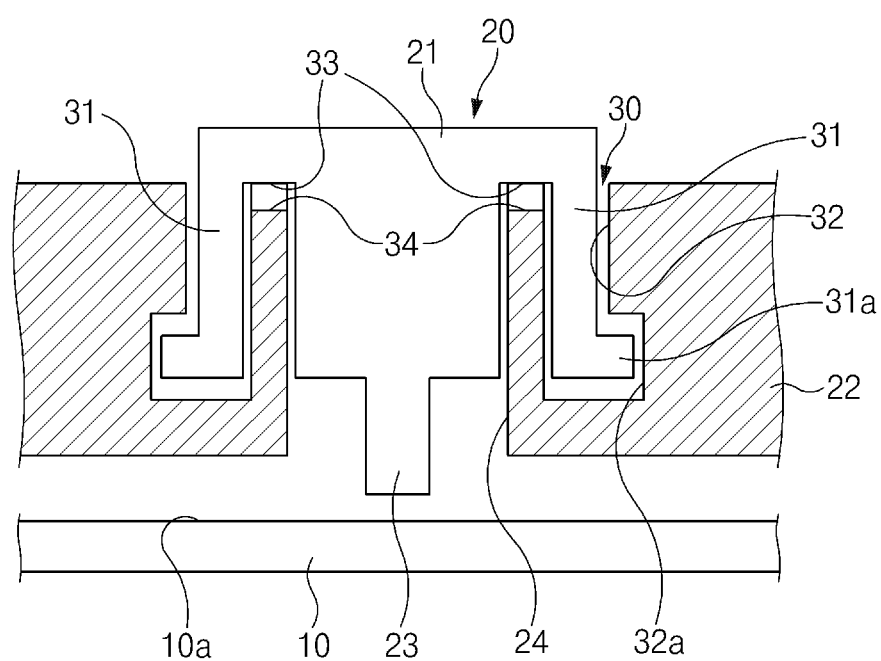
FIG. 3 is a sectional view illustrating a mechanical operating unit of a touch input device, according to another embodiment of the present disclosure.
Figure 4:
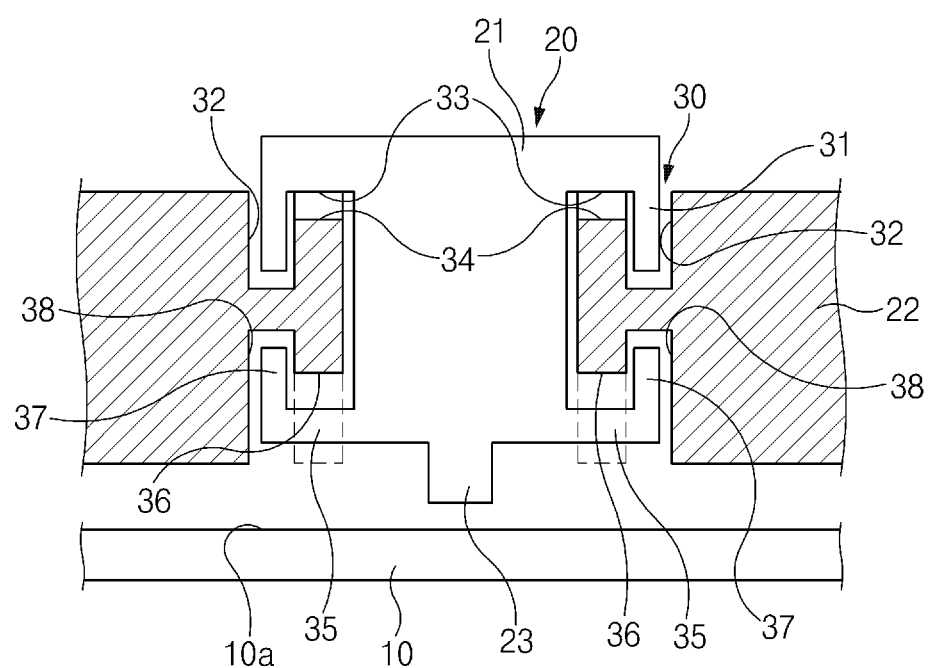
FIG. 4 is a sectional view illustrating a mechanical operating unit of a touch input device, according to another embodiment of the present disclosure.

FIGS. 2 to 10 depict alternate embodiments of the mechanical operating unit 20 according to the present disclosure. Referring to FIGS. 2 to 4, the touch button 21 may be configured such that the movement of the touch button 21 is guided by a guide unit 30 in the vertical direction. As described above, the touch button 21 may be configured such that the movement of the touch button 21 is guided by a guide unit 30 in the vertical direction, thereby restricting the input of unintentional force such as shearing force.

According to embodiments illustrated in FIGS. 2 to 4, the guide unit 30 may include at least one guide part 31 provided on a lateral side of the touch button 21 and a guide groove 32 which is defined in a portion of the support body 22 adjacent to the opening 24 to guide the guide part 31.

As the guide part 31 is guided in the vertical direction along the guide groove 32, the touch button 21 may exactly move in the vertical direction along the support body 22.

According to an embodiment illustrated in FIG. 2, the guide part 31 may extend in the vertical direction, and may be coupled to the lateral side of the touch button 21 through a coupling part 33. The coupling part 33 may extend in the horizontal direction from the lateral side of the touch button 21. An auxiliary guide groove 34 may be defined at the side of the opening 24 of the support body 22 and thus may guide the coupling part 33. As described above, as the coupling part 33 is guided along the auxiliary guide groove 34, the guide part 31 is guided along the guide groove 32 without the interference with the guide groove 32 or the obstruction by the guide groove 32.

According to the embodiment illustrated in FIG. 2, the length of the coupling part 33 is smaller than that of the guide part 31, and the length of the auxiliary guide groove 34 may be smaller than that of the guide groove 32. The length of the coupling part 33 and the length of the auxiliary guide groove 34 may be formed to the extent that the guide part 31 is guided along the guide groove 32 without the interference with the guide groove 32 or the obstruction by the guide groove 32.

According to the embodiment illustrated in FIG. 2, a pair of coupling parts 33 extends from intermediate portions of both lateral sides of the touch button 21, respectively. A pair of auxiliary guide grooves 34 may be defined in intermediate portions of both sides of the opening 24. A pair of guide parts 31 may be symmetrically disposed at both sides of the touch button 21 through a pair of coupling parts 33. As described above, the guide parts 31 and the coupling parts 33 are symmetrically disposed at both sides of the touch button 21. Accordingly, the touch button 21 may be more accurately guided when the touch button 21 is moved in the vertical direction.

According to an embodiment illustrated in FIG. 3, a pair of coupling parts 33 extend from both sides of upper ends of the touch button 21, and a pair of auxiliary guide grooves 34 may be defined in both sides of upper ends of an opening 24 and corresponding to the coupling parts 33. A pair of guide parts 31 may be symmetrically disposed at both sides of a touch button 21 through the coupling parts 33. As described above, the guide parts 31 and the coupling parts 33 are symmetrically disposed at both sides of the touch button 21. Accordingly, the touch button 21 may be more accurately guided when the touch button 21 moves in the vertical direction.

According to the embodiment illustrated in FIG. 3, a stopper part 31a may extend from a lower end of the guide part 31 in a direction perpendicular to the guide part 31. A stopper groove 32a may be defined in the lower end of the guide groove 32 and corresponding to the stopper part 31a. The touch button 21 may be prevented from completely deviating from the opening 24 of the support body 22 by the stopper part 31a and the stopper groove 32a.

According to an embodiment illustrated in FIG. 4, a pair of first coupling parts 33 extend from both sides of upper ends of a touch button 21, and a pair of second coupling parts 35 may extend from both sides of lower ends of the touch button 21.

According to the embodiment illustrated in FIG. 4, a pair of first auxiliary guide grooves 34 may be defined at both sides of upper ends of an opening 24 and corresponding to the first coupling parts 33. A pair of second auxiliary guide grooves 36 may be defined at both sides of lower ends of the opening 24 and corresponding to the second coupling parts 35.

According to the embodiment illustrated in FIG. 4, a pair of first guide parts 31 may be disposed symmetrically to each other at both sides of the upper ends of the touch button 21 through the first coupling parts 33. A pair of second guide parts 37 may be disposed symmetrically to each other at both sides of the lower ends of the touch button 21 through the second coupling parts 35.

According to the embodiment illustrated in FIG. 4, the support body 22 may be formed therein with a pair of first guide grooves 32, along which a pair of first guide parts 31 are guided, and may be formed therein with a pair of second guide grooves 38 along which a pair of second guide parts 37 are guided. In addition, the support body 22 may be formed therein with a pair of first auxiliary guide grooves 34 along which the first coupling parts 33 are guided and may be formed therein with a pair of second auxiliary guide grooves 36 along which the second coupling parts 35 are guided. As described above, the two pairs of guide parts 31 and 37 are formed symmetrically to each other about the touch button 21, and the two pairs of coupling parts 33 and 35 are formed symmetrically to each other about the touch button 21. Accordingly, the touch button 21 may be more accurately guided when the touch button 21 is moved in the vertical direction.

Figure 5:
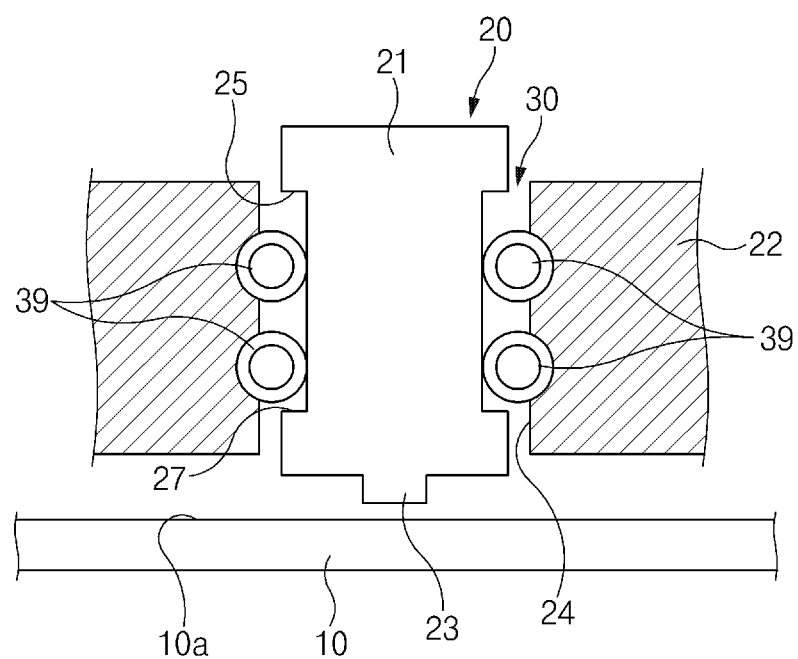
FIG. 5 is a sectional view illustrating a mechanical operating unit of a touch input device, according to another embodiment of the present disclosure.

According to another embodiment illustrated in FIG. 5, a guide unit 30 may include at least one pair of guide rollers 39 mounted in an opening 24 of a support body 22. Each of two lateral sides of a touch button 21 may be guided in a vertical direction in rolling contact with the guide rollers 39. Stopper parts 25 and 27 protrude from upper and lower portions of the touch button 21, respectively. The stopper parts 25 and 27 may prevent the touch button 21 from being completely separated from the opening 24 of the support body 22.

Referring to FIGS. 6 to 10, a touch button 21 may be mounted elastically with respect to the support body 22 through an elastic member 41, 42, 43, 44, or 45 such that the touch button 21 is restored to an original position thereof.

The elastic member 41, 42, 43, 44, or 45 is mounted to upwardly apply elastic force to the touch button 21. Accordingly, if the touch button 21 is not pressed, a touch tip 23 of the touch button 21 may be spaced apart from a touch surface 10a of a touch sensing element 10 by a slight distance due to elastic force of the elastic members 41, 42, 43, or 45.

If a pointing object (for example, the finger of a user, or a stylus tip) presses the touch button 21, pressure applied to the touch button 21 overcomes the elastic force of the elastic member 41, 42, 43, 44, or 45 and thus the touch tip 23 of the touch button 21 may touch a touch surface 10a of the touch sensing element 10.

Figure 6:
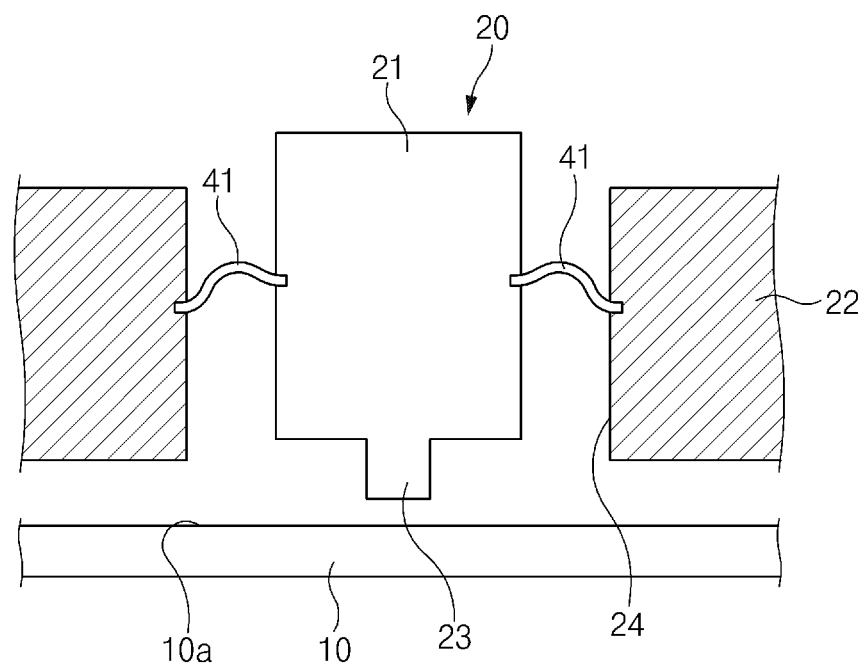
FIG. 6 is a sectional view illustrating a mechanical operating unit of a touch input device, according to another embodiment of the present disclosure.

According to an embodiment illustrated in FIG. 6, the elastic member 41 may include a leaf spring having a curved surface with a predetermined curvature. One end of the elastic member 41 is fixed to the lateral side of the touch button 21, and an opposite end of the elastic member 41 is fixed to an inner lateral side of the opening 24 of the support body 22. Accordingly, the elastic member 41 may be interposed between the touch button 21 and the opening 24 of the support body 22. In particular, at least one pair of elastic members 41 may be provided symmetrically to each other about the touch button 21.

Figure 7:
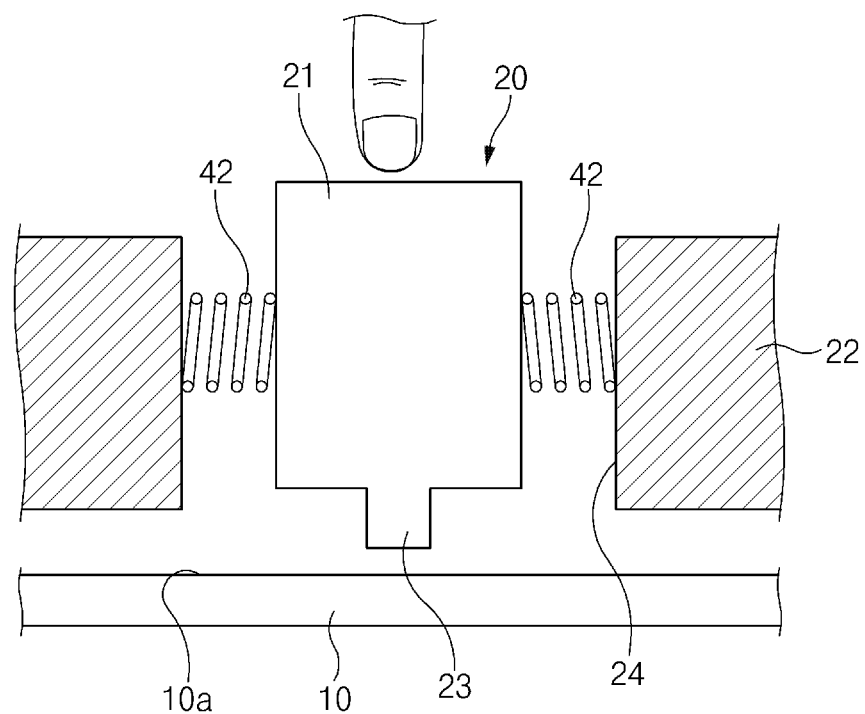
FIG. 7 is a sectional view illustrating a mechanical operating unit of a touch input device, according to another embodiment of the present disclosure.

According to an embodiment illustrated in FIG. 7, the elastic member 42 may include a coil spring having a large diameter. One end of the elastic member 42 is fixed to the lateral side of the touch button 21, and an opposite end of the elastic member 42 is fixed to the inner lateral side of the opening 24 of the support body 22. Accordingly, the elastic member 42 may be interposed between the lateral side of the touch button 21 and the opening 24 of the support body 22 while extending in a horizontal direction. In particular, at least one pair of elastic members 42 may be disposed symmetrically to each other on the touch button 21.

Figure 8:
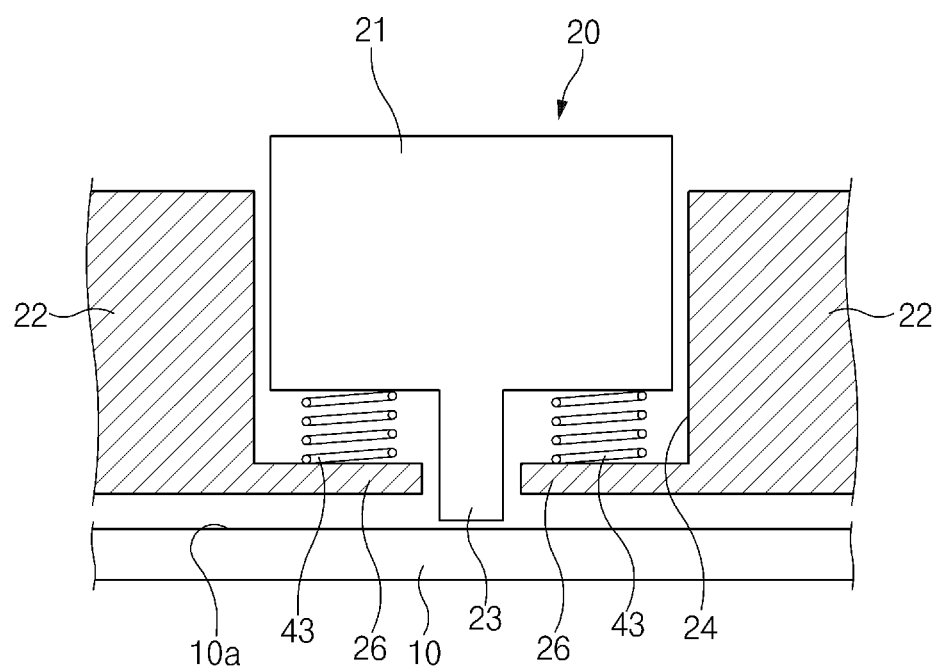
FIG. 8 is a sectional view illustrating a mechanical operating unit of a touch input device, according to another embodiment of the present disclosure.

According to an embodiment illustrated in FIG. 8, the elastic member 43 may include a coil spring having a small diameter. A retainer 26 may extend radially inward of a lower end of the opening 24 of the support body 22. A lower end of the elastic member 43 is supported by the retainer 26, and an upper end of the elastic member 43 is supported by a bottom surface of a touch button 21. Accordingly, an axial line of the elastic member 43 may be performed in a vertical direction. In particular, at least one pair of elastic members 43 may be disposed symmetrically to each other about the touch button 21.

Figure 9:
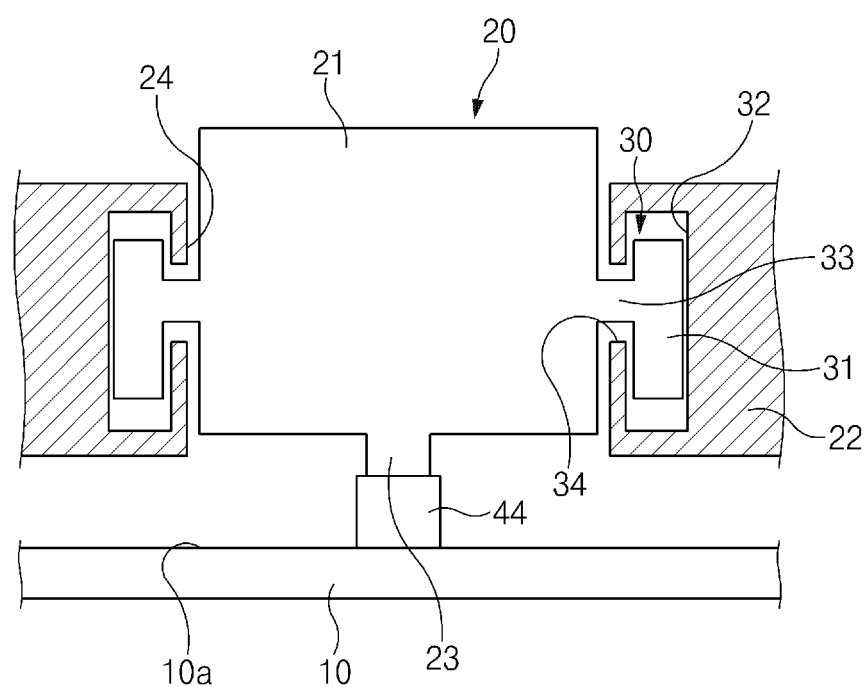
FIG. 9 is a sectional view illustrating a mechanical operating unit of a touch input device, according to another embodiment of the present disclosure.

According to an embodiment illustrated in FIG. 9, the elastic member 44 may be formed of an elastic material such as rubber. The elastic member 44 may be attached to a bottom surface of a touch tip 23 of a touch button 21.

Figure 10:
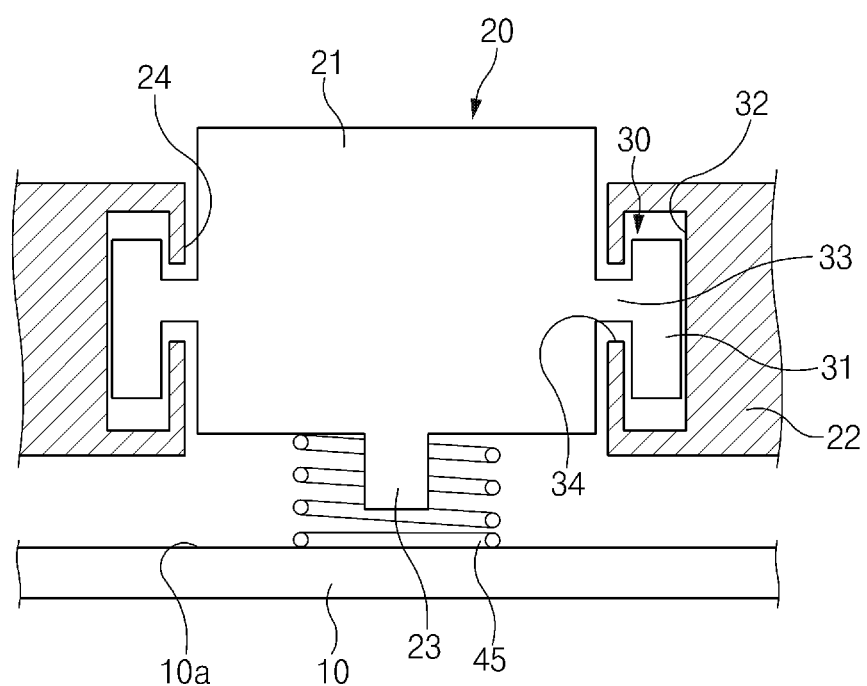
FIG. 10 is a sectional view illustrating a mechanical operating unit of a touch input device, according to another embodiment of the present disclosure.

According to an embodiment as illustrated in FIG. 10, the elastic member 45 may include a coil spring, and an axial line of the elastic member 45 may be disposed in the vertical direction. An upper end of the elastic member 45 is supported by a bottom surface of the touch button 21, and a lower end of the elastic member 45 is supported by a touch surface 10a. A coil portion of the elastic member 45 may be disposed to surround an outer surface of the touch tip 23.

According to the embodiments as illustrated in FIGS. 9 and 10, even if there is no touch input (that is, the touch button 21 is not pressed), the lower end of the elastic member 44 or 45 is maintained in contact with the touch surface 10a Accordingly, even if there is no touch input, since the loads of the elastic member 44 or 45, the touch button 21, and the support body 22 may be slightly applied to the touch surface 10a, a plurality of force sensors 5 may be configured to sense force applied thereto while subtracting the loads of the elastic member 44 or 45, the touch button 21, and the support body 22.

Referring to FIGS. 11 to 14, the edge of a support body 22 may be detachably coupled to the edge of a case 15. Accordingly, when a mechanical operating unit 20 does not need to be used, the mechanical operating unit 20 may be easily detached from the case 15. Accordingly, a user may directly touch a touch surface 10a of a touch sensing element 10.

Figure 11:
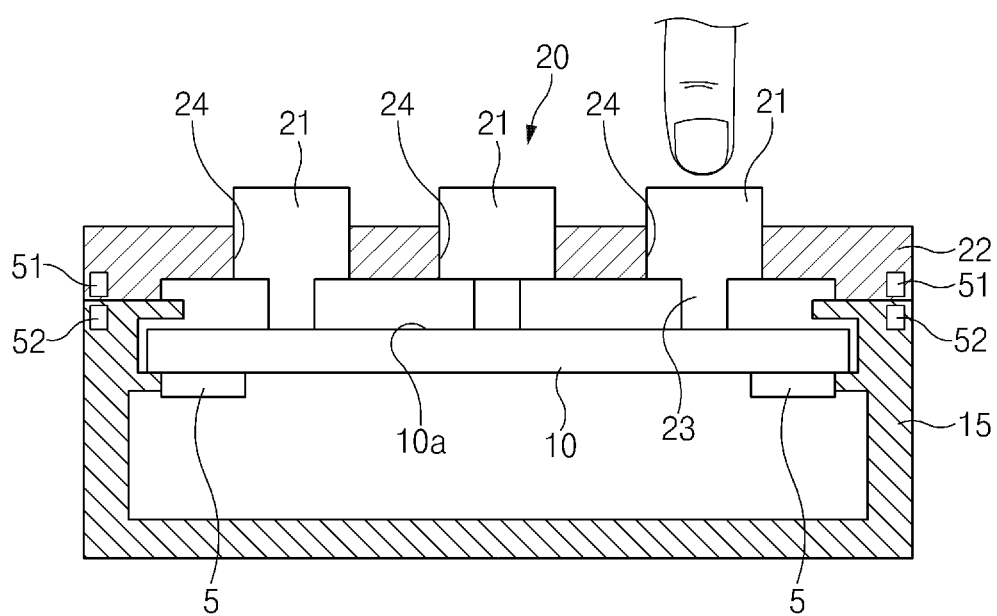
FIG. 11 is a schematic sectional view illustrating the state that the mechanical operating unit of the touch input device is assembled with a case, according to an embodiment of the present disclosure.

According to an embodiment illustrated in FIG. 11, a first magnet 51 may be mounted to be buried in an edge of the support body 22, and a second magnet 52 may be mounted to be burred in an edge of the case 15. Accordingly, the support body 22 may be detachably mounted on both sides of the case 15 by magnetic force of the first and second magnets 51 and 52.

Figure 12:
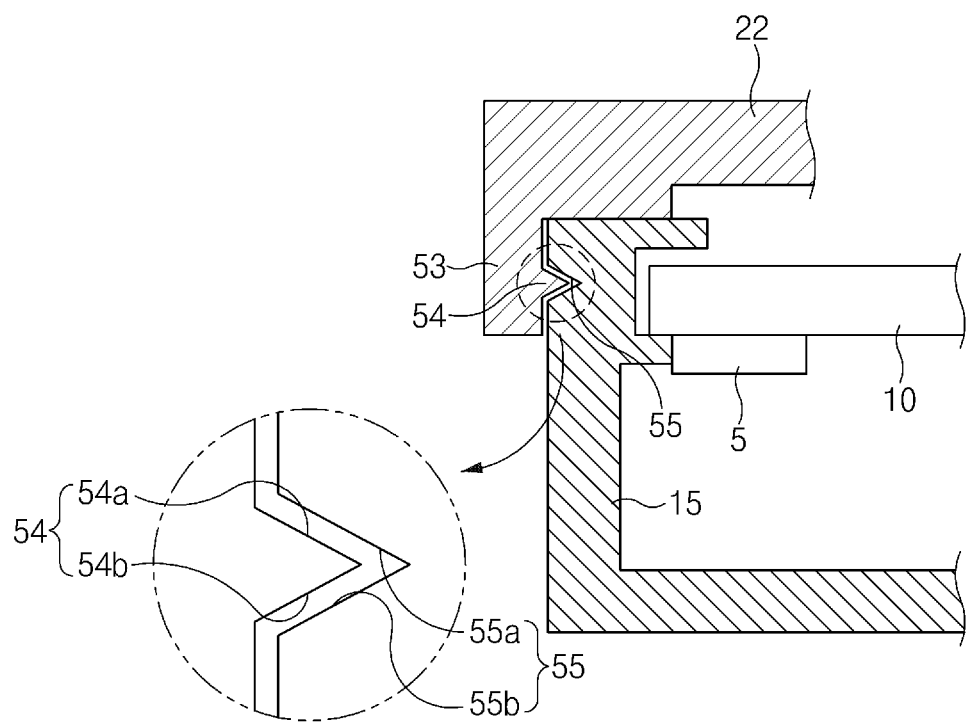
FIG. 12 is a sectional view illustrating the state that the mechanical operating unit of the touch input device is assembled with a case, according to an embodiment of the present disclosure.
Figure 13:
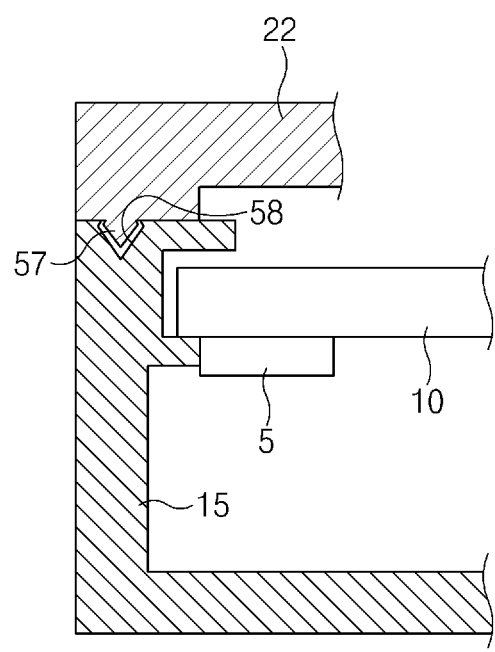
FIG. 13 is a sectional view illustrating the state that the mechanical operating unit of the touch input device is assembled with a case, according to another embodiment of the present disclosure.
Figure 14:
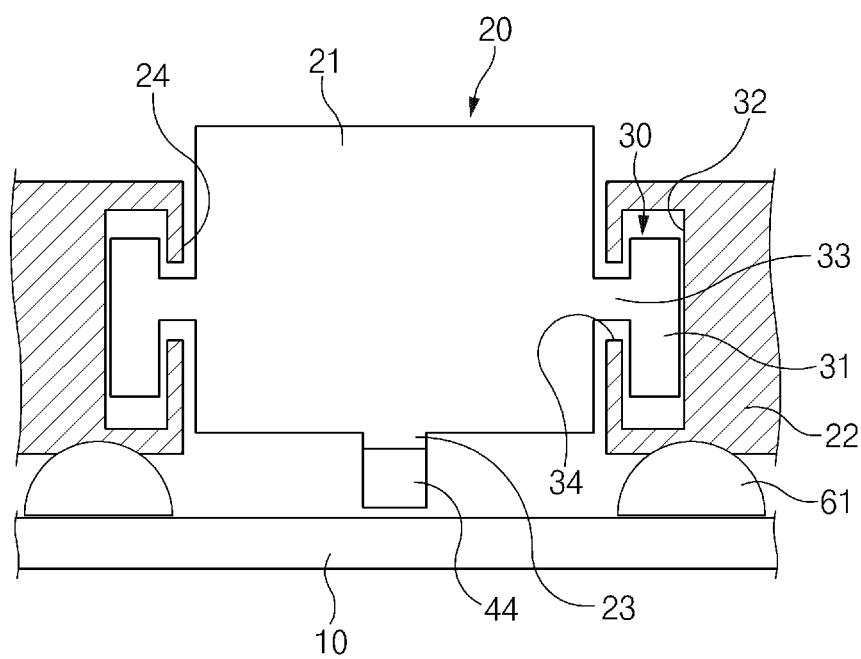
FIG. 14 is a sectional view illustrating the state that the mechanical operating unit of the touch input device is assembled with a case, according to another embodiment of the present disclosure.

FIGS. 12 to 14 depict alternate embodiments of the mechanical operating unit 20 assembled to the case 15 according to the present disclosure. Referring to FIGS. 12 and 13, as the edge of the support body 22 is snap-coupled to the edge of the case 15, the support body 22 may be detachably coupled to the case 15.

According to an embodiment illustrated in FIG. 12, an extension part 53 may extend from the edge of the support body 22 to cover a lateral side of the edge of the case 15. The extension part 53 may have a coupling protrusion 54 protruding from an inner surface thereof, and the case 15 may have a coupling groove 55 defined in the lateral side of the edge thereof.

The coupling protrusion 54 may have at least one of inclined surfaces 54a and 54b, and the two inclined surfaces 54a and 54b may be disposed symmetrically to each other in a vertical direction. The coupling groove 55 may have at least one of inclined surfaces 55a and 55b matched with the inclined surfaces 54a and 54b of the coupling protrusion 54, and the two inclined surfaces 55a and 55b may be disposed symmetrically to each other in the vertical direction. When the coupling protrusion 54 is snap-coupled to the coupling groove 55 in such a manner that the inclined surfaces 54a and 54b of the coupling protrusion 54 are matched with the inclined surfaces 55a and 55b of the coupling groove 55, the support body 22 may be coupled to the case 15.

As described above, the support body 22 may be significantly easily detached from the case 15 or coupled to the case 15 through the inclined surfaces 54a and 54b of the coupling protrusion 54 and the inclined surfaces 55a and 55b of the coupling groove 55.

According to an embodiment illustrated in FIG. 13, the support body 22 may have a coupling protrusion 57 protruding from a bottom surface of the edge thereof, and the case 15 may have a coupling groove 58 defined in a top surface of the edge thereof.

The coupling protrusion 57 may have a diamond-shaped cross section, and the coupling groove 58 may have a diamond-shaped cross section corresponding to the shape of the coupling protrusion 57. Therefore, when the coupling protrusion 57 is snap-coupled to the coupling groove 58, the support body 22 may be coupled to the case 15. As described above, as the coupling protrusion 57 and the coupling groove 58 have the diamond-shaped cross section, the support body 22 may be significantly easily detached from the case 15 or coupled to the case 15.

According to an embodiment illustrated in FIG. 14, a suction cup 61 is formed on a bottom surface of the support body 22. The suction cup 61 may be detachably attached to a touch surface 10a of a touch sensing element 10 in a vacuum suction manner.

Meanwhile, a plurality of force sensors 5 may be electrically connected with a control unit (not shown). When a touch tip 23 of a touch button 21 of a mechanical operating unit 20 touches a touch surface 10a of a touch sensing element 10, the force from the touch may be applied to the force sensors 5 through the touch sensing element 10. Each of the force sensors 5 may measure the relative strength of force applied thereto, and a control unit (not shown) may calculate to the position of the touch by substituting the relative strengths of the force measured by the force sensors 5 into a force equation and a moment equation and thus the position of the touch may be determined. As described above, when a set touch area of the touch sensing element 10 is touched by the touch tip 23 of the touch button 21, a function set by the control unit (not shown) may be performed.

As described above, according to the present disclosure, the touch input device may not only perform blind control, but may improve the user convenience therefor by detachably mounting the mechanical operating unit, which provides physical operability, on the touch sensing element.

In addition, according to the present disclosure, the touch button may be configured such that movement of the touch button is guided in the vertical direction, thereby restricting the input of unintentional force such as shearing force.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A touch input device, comprising:
   a touch sensing element configured to sense a touch; and a mechanical operating unit detachably mounted on the touch sensing element, wherein the mechanical operating unit comprises:

at least one touch button which is movable in a vertical direction;

a support body having an opening in which the touch button is movably mounted; and a guide unit configured to guide the touch button when the touch button moves, wherein the guide unit comprises at least one guide part provided on a lateral side of the touch button and a guide groove defined in a portion of the support body adjacent to the opening to guide the guide part, wherein the guide part extends in a vertical direction and is coupled to the lateral side of the touch button through a coupling part, wherein the coupling part extends in a horizontal direction from the lateral side of the touch button, wherein an auxiliary guide groove is defined at a side of the opening of the support body to guide the coupling part, wherein the length of the coupling part is smaller than that of the guide part, and wherein the length of the auxiliary guide groove is smaller than that of the guide groove.

2. The touch input device of claim 1, wherein the support body comprises at least one opening, and wherein the touch button is mounted in the opening movably in the vertical direction.

3. The touch input device of claim 1, wherein the touch button is guided by a guide unit when the touch button moves in the vertical direction.

4. A touch input device, comprising:

a case;

a touch sensing element supported by the case;

a plurality of force sensors mounted on a bottom surface of the touch sensing element; and a mechanical operating unit detachably mounted on at least one of the touch sensing element and the case, wherein the mechanical operating unit comprises:

at least one movable touch button; and a support body having an opening in which the touch button is movably mounted; and a guide unit configured to guide the touch button when the touch button moves, wherein the guide unit comprises at least one guide part provided on a lateral side of the touch button and a guide groove defined in a portion of the support body adjacent to the opening to guide the guide part, wherein the guide part extends in a vertical direction and is coupled to the lateral side of the touch button through a coupling part, wherein the coupling part extends in a horizontal direction from the lateral side of the touch button, wherein an auxiliary guide groove is defined at a side of the opening of the support body to guide the coupling part, wherein the length of the coupling part is smaller than that of the guide part, and wherein the length of the auxiliary guide groove is smaller than that of the guide groove.

5. The touch input device of claim 4, wherein the support body has an edge which is detachably snap-coupled to an edge of the case.

6. The touch input device of claim 4, wherein the support body has an edge which is detachably coupled to an edge of the case by magnetic force.

7. The touch input device of claim 4, wherein the guide part comprises a stopper part, and wherein a stopper groove is defined in the guide groove and defined corresponding to the stopper part.

8. The touch input device of claim 4, wherein the touch button is mounted elastically with respect to the support body through an elastic member to be restored.

9. The touch input device of claim 8, wherein the elastic member is a leaf spring having a curved surface.

10. The touch input device of claim 8, wherein the elastic member is a coil spring disposed in a horizontal direction.

11. The touch input device of claim 8, wherein the elastic member is a coil spring disposed in a vertical direction.

12. The touch input device of claim 8, wherein the elastic member includes an elastic substance attached to a bottom surface of the touch button.

13. A touch input device, comprising:

a case;

a touch sensing element supported by the case;

a plurality of force sensors mounted on a bottom surface of the touch sensing element; and a mechanical operating unit detachably mounted on at least one of the touch sensing element and the case, wherein the mechanical operating unit comprises:

at least one movable touch button; and a support body having an opening in which the touch button is movably mounted; and a guide unit configured to guide the touch button when the touch button moves, wherein the guide unit comprises at least one pair of guide rollers mounted in the opening of the support body, wherein each of two lateral sides of the touch button is guided in a vertical direction in rolling contact with the one pair of guide rollers, and wherein a stopper protrudes from each of upper and lower portions of the touch button.

* * * * *